(12) United States Patent
Khlat et al.

(10) Patent No.: US 10,505,502 B2
(45) Date of Patent: *Dec. 10, 2019

(54) WIDE MODULATION BANDWIDTH RADIO FREQUENCY CIRCUIT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/261,692

(22) Filed: Jan. 30, 2019

(65) Prior Publication Data

US 2019/0245496 A1  Aug. 8, 2019

Related U.S. Application Data

(63) Continuation of application No. 15/993,705, filed on May 31, 2018, now Pat. No. 10,230,340.
(Continued)

(51) Int. Cl.
*H04B 1/04* (2006.01)
*H03F 3/193* (2006.01)
(Continued)

(52) U.S. Cl.
CPC .......... *H03F 3/193* (2013.01); *H03F 1/0205* (2013.01); *H03F 1/3205* (2013.01); *H03F 3/21* (2013.01);
(Continued)

(58) Field of Classification Search
CPC ...... H03F 3/193; H03F 1/0205; H03F 1/3205; H03F 3/21; H03F 2200/102;
(Continued)

(56) References Cited

U.S. PATENT DOCUMENTS 8,493,141 B2   7/2013 Khlat et al.
9,020,451 B2   4/2015 Khlat
(Continued)

OTHER PUBLICATIONS

U.S. Appl. No. 10/230,340, filed Mar. 2019, Khlat; Nadim.*
(Continued)

*Primary Examiner* — Nhan T Le
(74) *Attorney, Agent, or Firm* — Withrow & Terranova, P.L.L.C.

(57) ABSTRACT

A wide modulation bandwidth radio frequency (RF) circuit is provided. In examples discussed herein, the RF front-end circuit includes a tracker circuit configured to generate a modulated voltage at a wide modulation bandwidth. The modulated voltage can be used by an amplifier circuit(s) for amplifying an RF signal(s). Notably, the tracker circuit may have inherent frequency-dependent impedance that can interact with a load current of the amplifier circuit(s) to cause degradation in the modulated voltage, which can further lead to distortions in an RF offset spectrum. In this regard, a notch circuit is provided and configured to operate at an appropriate notch frequency and a notch bandwidth to filter the modulated voltage in the RF offset spectrum. As a result, it may be possible to reduce the distortions caused by the modulated voltage degradation in the RF offset spectrum, thus helping to improve linearity and efficiency of the amplifier circuit(s).

21 Claims, 9 Drawing Sheets

Related U.S. Application Data

(60) Provisional application No. 62/626,950, filed on Feb. 6, 2018.

(51) Int. Cl.
  *H03F 1/02* (2006.01)
  *H03F 1/32* (2006.01)
  *H04L 5/14* (2006.01)
  *H03F 3/21* (2006.01)
  *H04B 1/40* (2015.01)

(52) U.S. Cl.
  CPC .......... *H04L 5/14* (2013.01); *H03F 2200/102* (2013.01); *H03F 2200/171* (2013.01); *H03F 2200/267* (2013.01); *H03F 2200/451* (2013.01); *H04B 1/40* (2013.01)

(58) Field of Classification Search
  CPC ......... H03F 2200/171; H03F 2200/451; H03F 2200/267; H04B 1/40; H04L 5/14
  See application file for complete search history.

(56) References Cited

U.S. PATENT DOCUMENTS

| | | |
|---|---|---|
| 9,041,364 B2 | 5/2015 | Khlat |
| 9,298,198 B2 | 3/2016 | Kay et al. |
| 9,362,813 B2* | 6/2016 | Hu .......................... H02M 1/00 |
| 9,377,797 B2 | 6/2016 | Kay et al. |
| 9,923,520 B1* | 3/2018 | Abdelfattah ............ H02M 1/08 |

OTHER PUBLICATIONS

U.S. Appl. No. 10/128,798, filed Nov. 2018, Duncan; Joseph.*
U.S. Appl. No. 10/230,340, filed Mar. 12, 2019, Khalt et al.
Notice of Allowance for U.S. Appl. No. 15/993,705, dated Oct. 31, 2018, 7 pages.

* cited by examiner

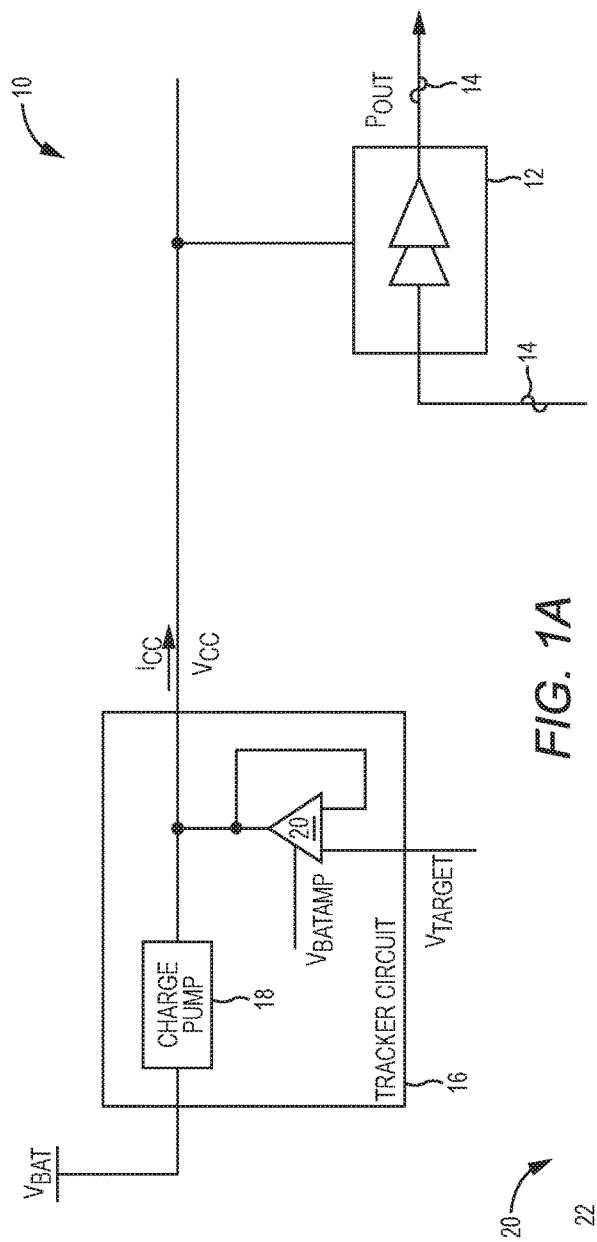
FIG. 1A
FIG. 1B
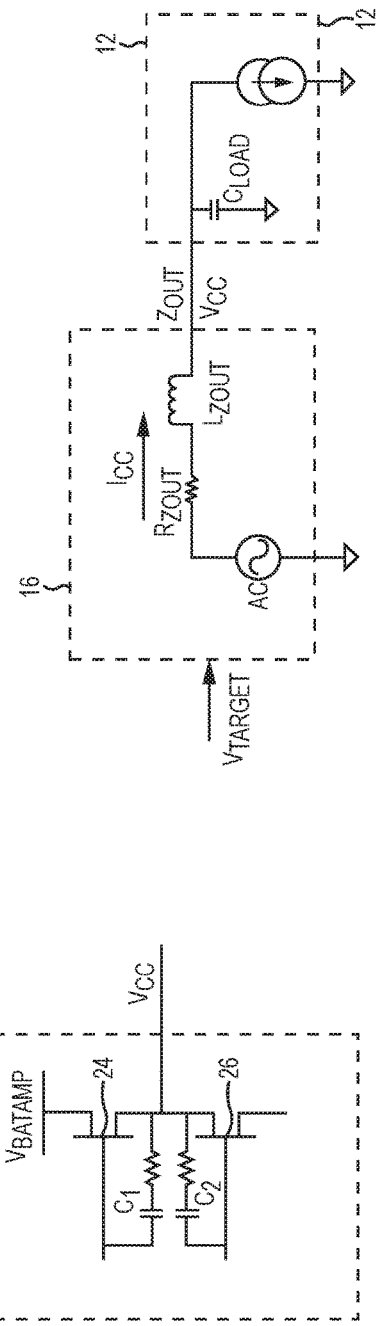
FIG. 1C

WIDE MODULATION BANDWIDTH RADIO FREQUENCY CIRCUIT

RELATED APPLICATIONS

This application is a continuation of U.S. patent application Ser. No. 15/993,705, filed on May 31, 2018, now U.S. Pat. No. 10,230,340, which claims the benefit of provisional patent application Ser. No. 62/626,950, filed Feb. 6, 2018, the disclosures of which are hereby incorporated herein by reference in their entireties.

FIELD OF THE DISCLOSURE

The technology of the disclosure relates generally to radio frequency (RF) front-end circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires a higher data rate offered by wireless communication technologies, such as fifth generation new radio (5G-NR) and Wi-Fi that typically operates in higher frequency spectrums. To achieve higher data rates with increased robustness in the higher frequency spectrums, sophisticated power amplifiers (PAs) may be employed to increase output power of radio frequency (RF) signals (e.g., maintaining sufficient energy per bit) prior to transmitting the RF signals.

Envelope tracking (ET) is a power management technology designed to improve efficiency levels of the PAs to help reduce power dissipation in the mobile communication devices. As the name suggests, an ET circuit is configured to generate a modulated voltage that keeps track of a target voltage envelope and provide the modulated voltage to the PAs for amplifying the RF signal(s). However, the ET circuit has inherent output impedance that can interact with an inherent load of the PAs, particularly at a higher modulation bandwidth (e.g., >100 MHz). Consequently, the modulated voltage may be degraded, thus leading to distortions being created outside the modulation bandwidth. As such, it may be desirable to control the output impedance of the ET circuit to help reduce the distortions associated with the higher modulation bandwidth.

SUMMARY

Embodiments of the disclosure relate to a wide modulation bandwidth radio frequency (RF) circuit. In examples discussed herein, the RF front-end circuit includes a tracker circuit configured to generate a modulated voltage (e.g., an envelope tracking modulated voltage) at a wide modulation bandwidth (e.g., up to 160 MHz). The modulated voltage can be used by an amplifier circuit(s) for amplifying an RF signal(s). Notably, the tracker circuit may have inherent frequency-dependent impedance that can interact with a load current of the amplifier circuit(s) to cause degradation in the modulated voltage, which can further lead to distortions in an RF offset spectrum. In this regard, a notch circuit is provided and configured to operate at an appropriate notch frequency and notch bandwidth to filter the modulated voltage in the RF offset spectrum. As a result, it may be possible to reduce the distortions caused by the modulated voltage degradation in the RF offset spectrum, thus helping to improve linearity and efficiency of the amplifier circuit(s).

In one aspect, a wide modulation bandwidth RF circuit is provided. The wide modulation bandwidth RF circuit includes a tracker circuit comprising a tracker output and configured to generate a modulated voltage at the tracker output. The wide modulation bandwidth RF circuit also includes an amplifier circuit coupled to the tracker output and configured to amplify an RF transmit signal based on the modulated voltage for transmission in a time division duplex (TDD) RF spectrum. The wide modulation bandwidth RF circuit also includes a notch circuit coupled between the tracker output and a ground, the notch circuit is configured to filter the modulated voltage in an RF offset spectrum adjacent to the TDD RF spectrum. The wide modulation bandwidth RF circuit also includes a control circuit. The control circuit is configured to adjust a notch frequency of the notch circuit to cause the notch frequency to fall in the RF offset spectrum. The control circuit is also configured to adjust a notch bandwidth of the notch circuit to cause the notch bandwidth to overlap with at least a portion of the RF offset spectrum.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1A is a schematic diagram of an exemplary existing radio frequency (RF) circuit in which an amplifier circuit is configured to amplify an RF signal based on a modulated voltage generated by a tracker circuit;

FIG. 1B is a schematic diagram providing an exemplary illustration of an output stage of tracker circuitry in the existing RF circuit of FIG. 1A;

FIG. 1C is a schematic diagram showing that an output impedance of the tracker circuit of FIG. 1A can be modeled by an output inductance and an output resistance;

Figure 5:
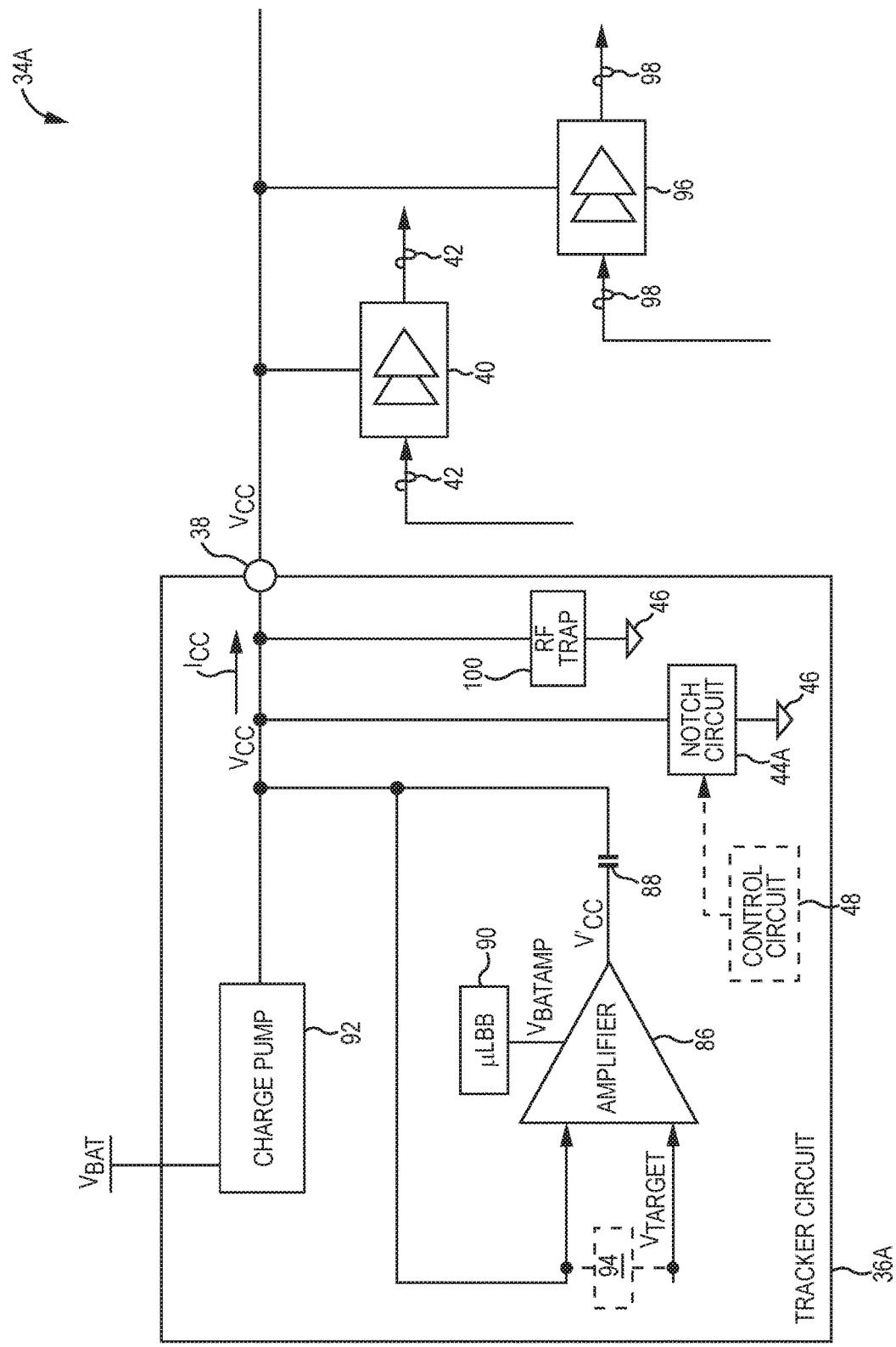
FIG. 5 is a schematic diagram of an exemplary wide modulation bandwidth RF circuit configured to support TDD and frequency division duplex (FDD) transmissions.
Figure 6A:
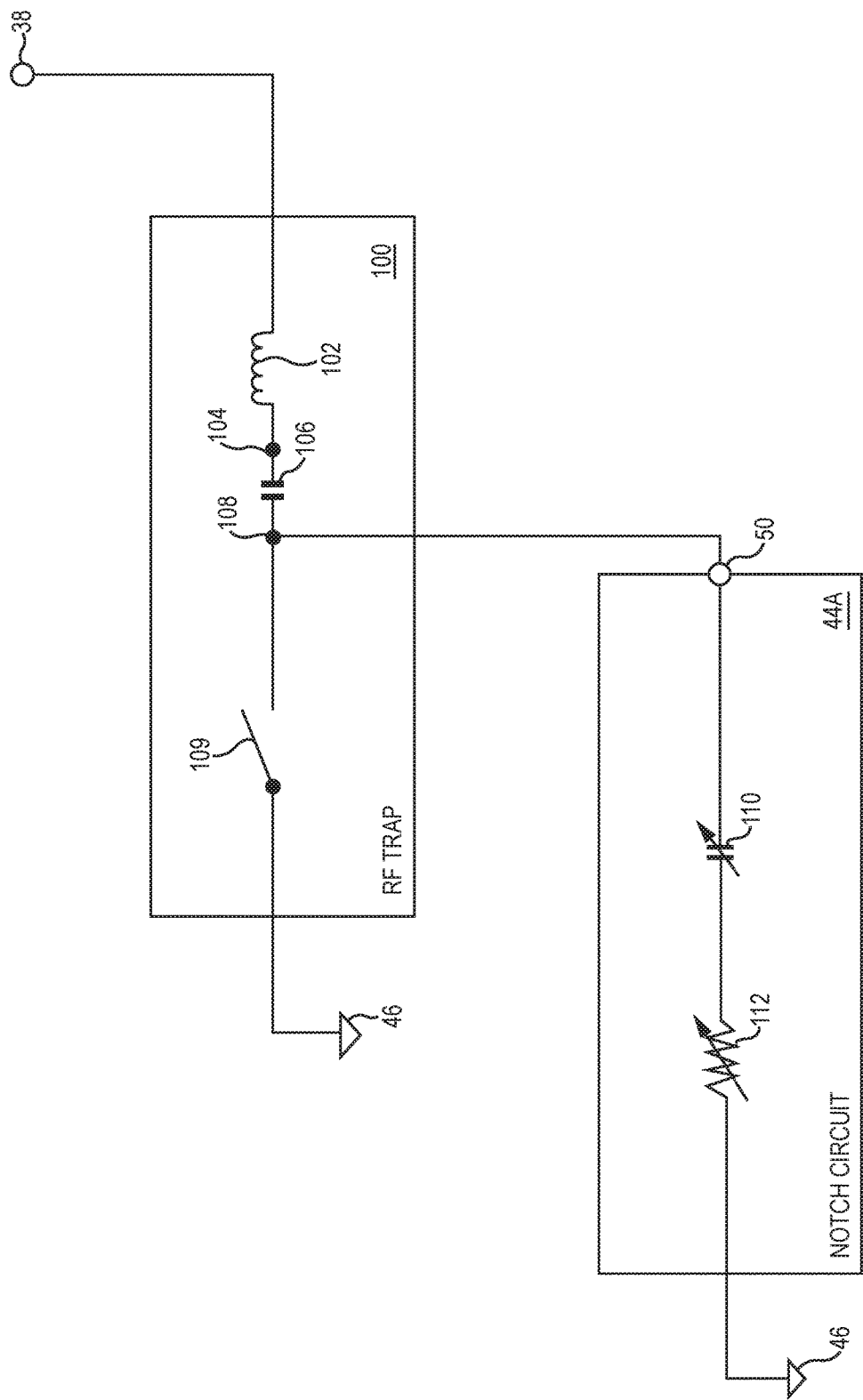
Figure 6B:
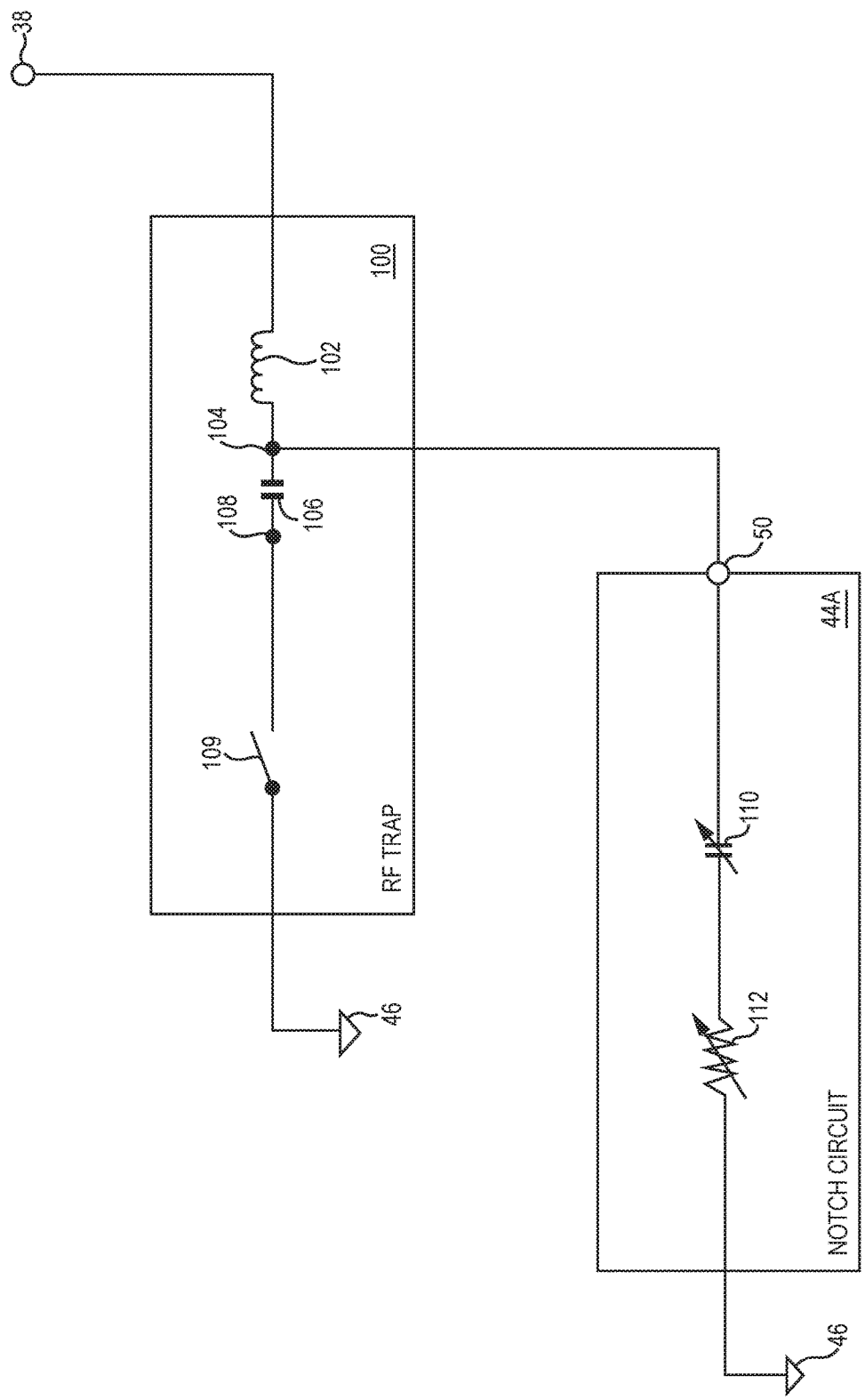

FIG. 6A is a schematic diagram illustrating an exemplary configuration of a notch circuit and an RF trap in the wide modulation bandwidth RF circuit of FIG. 5 according to one embodiment of the present disclosure; and FIG. 6B is a schematic diagram illustrating an exemplary configuration of a notch circuit and an RF trap in the wide modulation bandwidth RF circuit of FIG. 5 according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a wide modulation bandwidth radio frequency (RF) circuit. In examples discussed herein, the RF front-end circuit includes a tracker circuit configured to generate a modulated voltage (e.g., an envelope tracking modulated voltage) at a wide modulation bandwidth (e.g., up to 160 MHz). The modulated voltage can be used by an amplifier circuit(s) for amplifying an RF signal(s). Notably, the tracker circuit may have inherent frequency-dependent impedance that can interact with a load current of the amplifier circuit(s) to cause degradation in the modulated voltage, which can further lead to distortions in an RF offset spectrum. In this regard, a notch circuit is provided and configured to operate at an appropriate notch frequency and notch bandwidth to filter the modulated voltage in the RF offset spectrum. As a result, it may be possible to reduce the distortions caused by the modulated voltage degradation in the RF offset spectrum, thus helping to improve linearity and efficiency of the amplifier circuit(s).

Before discussing the wide modulation bandwidth RF circuit of the present disclosure, a brief overview of an existing RF circuit is first discussed with reference to FIGS. 1A-1D to help understand common issues related to supporting wide bandwidth modulation in an existing RF circuit. The discussion of specific exemplary aspects of a wide modulation bandwidth RF circuit that can overcome the common issues in the existing RF circuit starts below with reference to FIG. 2.

In this regard, FIG. 1A is a schematic diagram of an exemplary existing RF circuit 10 in which an amplifier circuit 12 is configured to amplify an RF signal 14 based on a modulated voltage $V_{CC}$ generated by a tracker circuit 16. The amplifier circuit 12 has a load line $R_{LOAD}$ that induces a current $I_{CC}$ based on the modulated voltage $V_{CC}$ ($I_{CC}=V_{CC} \div R_{LOAD}$). The current $I_{CC}$ and the modulated voltage $V_{CC}$ enable the amplifier circuit 12 to amplify the RF signal 14 to an output power $P_{OUT}$.

The tracker circuit 16 includes charge pump circuitry 18 and an amplifier 20. The charge pump circuitry 18 is coupled to a battery voltage $V_{BAT}$ and configured to generate the current $I_{CC}$, which may include both a direct current and an alternating current. The amplifier 20 receives a supply voltage $V_{BATAMP}$, which can be derived from the battery voltage $V_{BAT}$. The amplifier 20 may receive a target voltage $V_{TARGET}$ and generates the modulated voltage $V_{CC}$ as an envelope tracking (ET) modulated voltage based on the target voltage $V_{TARGET}$.

The RF signal 14 may be modulated to follow a time-variant power envelope that can produce a higher peak power from time to time. Accordingly, the tracker circuit 16 is required to provide the ET modulated voltage $V_{CC}$ and the current $I_{CC}$ at a sufficient level such that the amplifier circuit 12 can amplify the RF signal 14 to the output power $P_{OUT}$ corresponding to the higher peak power of the time-variant power envelope. For example, the RF signal 14 has a peak power in excess of 28.5 dBm and the amplifier circuit 12 is required to amplify the RF signal 14 to a Class 2 output power in excess of 26 dBm. If the amplifier circuit 12 has 45% power amplifier efficiency (PAE) and the ET modulated voltage $V_{CC}$ is at 5 V, the current $I_{CC}$ generated by the tracker circuit 16 would need to be approximately 314.6 mA. As such, the amplifier 20 needs to employ an output stage large enough to produce the required current $I_{CC}$.

FIG. 1B is a schematic diagram providing an exemplary illustration of an output stage 22 of the amplifier 20 in the existing RF circuit 10 of FIG. 1A. The output stage 22 includes a first transistor 24 and a second transistor 26 disposed in series. The first transistor 24 may be a p-type field-effect transistor (pFET) and the second transistor 26 may be an n-type field-effect transistor (nFET). When the supply voltage $V_{BATAMP}$ is applied to the output stage 22, the first transistor 24 and the second transistor 26 can produce parasitic capacitance. As such, a pair of balance capacitors $C_1$ and $C_2$ may be provided in the output stage 22 to help balance the parasitic capacitances.

As stated above, the output stage 22 needs to produce a sufficiently large current $I_{CC}$ such that the amplifier circuit 12 of FIG. 1A can amplify the RF signal 14 to the output power $P_{OUT}$ corresponding to the higher peak power of the time-variant power envelope. In this regard, the first transistor 24 and the second transistor 26 need to be sufficiently large, which can in turn produce larger parasitic capacitance during operation. As a result, the balance capacitors $C_1$ and $C_2$ need to be bigger so as to provide a higher balance capacitance to balance the increased parasitic capacitance. The increased size of the first transistor 24, the second transistor 26, and the balance capacitors $C_1$ and $C_2$ can lead to a larger footprint and more power consumption of the output stage 22. In addition, the higher balance capacitance introduced by the balance capacitors $C_1$ and $C_2$ can reduce slew rate of the amplifier 20, which reduces voltage modulation bandwidth of the amplifier 20.

With reference back to FIG. 1A, the tracker circuit 16 includes inherent output impedance $Z_{OUT}$, which can be modeled as being primarily determined by an output inductance $L_{ZOUT}$ and an output resistance $R_{ZOUT}$, as shown in FIG. 1C. FIG. 1C is a schematic diagram showing that the output impedance $Z_{OUT}$ of the tracker circuit 16 of FIG. 1A can be modeled by the output inductance $L_{ZOUT}$ and the output resistance $R_{ZOUT}$. Common elements between FIGS. 1A-1C are shown therein with common element numbers and will not be re-described herein.

Impact of output impedance $Z_{OUT}$ on the modulated output voltage $V_{CC}$ can be expressed in equation (Eq. 1) below.

$$V_{CC}=V_{TARGET}-L_{ZOUT}\cdot dI_{CC}/dt-R_{ZOUT}\cdot I_{CC} \quad (Eq.\ 1)$$

As shown in equation (Eq. 1) above, the output impedance $Z_{OUT}$ can cause a voltage deviation between the target voltage $V_{TARGET}$ and the ET modulated voltage $V_{CC}$, which can be worsened when the RF signal 14 is modulated at a wider modulation bandwidth (e.g., up to 160 MHz). In addition, the output impedance $Z_{OUT}$ can increase power dissipation in the existing RF circuit 10. Furthermore, when capacitance of the balance capacitors $C_1$ and $C_2$ in the output stage 22 of the tracker circuit 16 increases, the output impedance $Z_{OUT}$ can increase as well, thus reducing a slew rate of the tracker circuit 16 and causing further deviation in the modulated voltage $V_{CC}$.

Figure 1D:
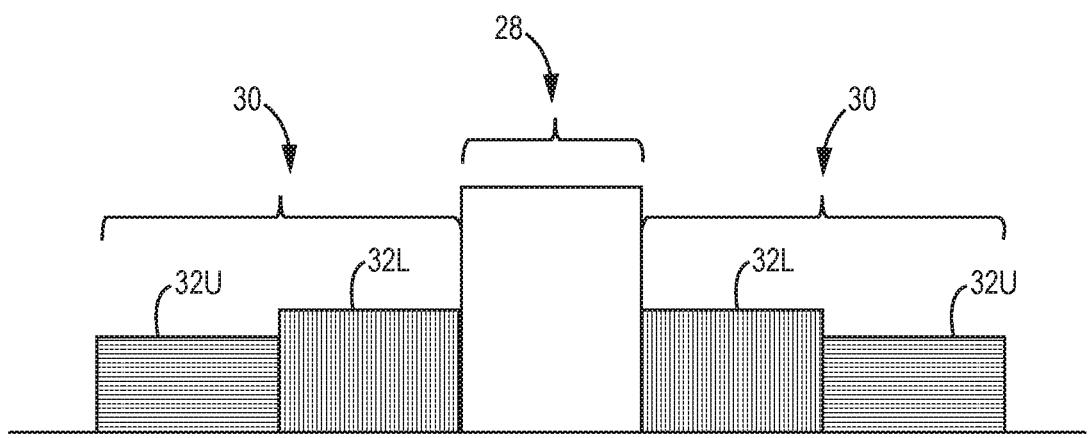
FIG. 1D is a schematic diagram providing an exemplary illustration of a time division duplex (TDD) RF spectrum and adjacent RF offset spectrums.

The amplifier circuit 12 may be configured to amplify the RF signal 14 for transmission in a time division duplex (TDD) RF spectrum 28, as shown in FIG. 1D. The TDD RF spectrum 28 is adjacent to an RF offset spectrum 30, which can be located above or below the TDD RF spectrum 28, but not overlapping the TDD RF spectrum 28.

The RF offset spectrum 30 may include a lower offset spectrum 32L and an upper offset spectrum 32U. The lower offset spectrum 32L and the upper offset spectrum 32U can correspond to equal or different bandwidths. For example, if the TDD RF spectrum 28 has a 100 MHz bandwidth, the RF offset spectrum 30 can have a 200 MHz bandwidth divided equally or non-equally between the lower offset spectrum 32L and the upper offset spectrum 32U.

With reference back to FIG. 1A, the amplifier circuit 12 may act as a current source to the tracker circuit 16. Notably, the current $I_{CC}$ may have a wide current spectrum, which can interact with the output impedance $Z_{OUT}$ to degrade the modulated voltage $V_{CC}$ and create significant energy content in the RF offset spectrum 30 as a result of spectral regrowth. Moreover, when the RF signal 14 is modulated at a wider modulation bandwidth (e.g., >100 MHz), the output impedance $Z_{OUT}$ tends to increase, thus further degrading the modulated voltage $V_{CC}$ and worsening the distortions in the RF offset spectrum 30. As such, it may be desirable to control the output impedance $Z_{OUT}$ to help reduce distortions (e.g., noise and ripple) in the RF offset spectrum 30.

Figure 2:
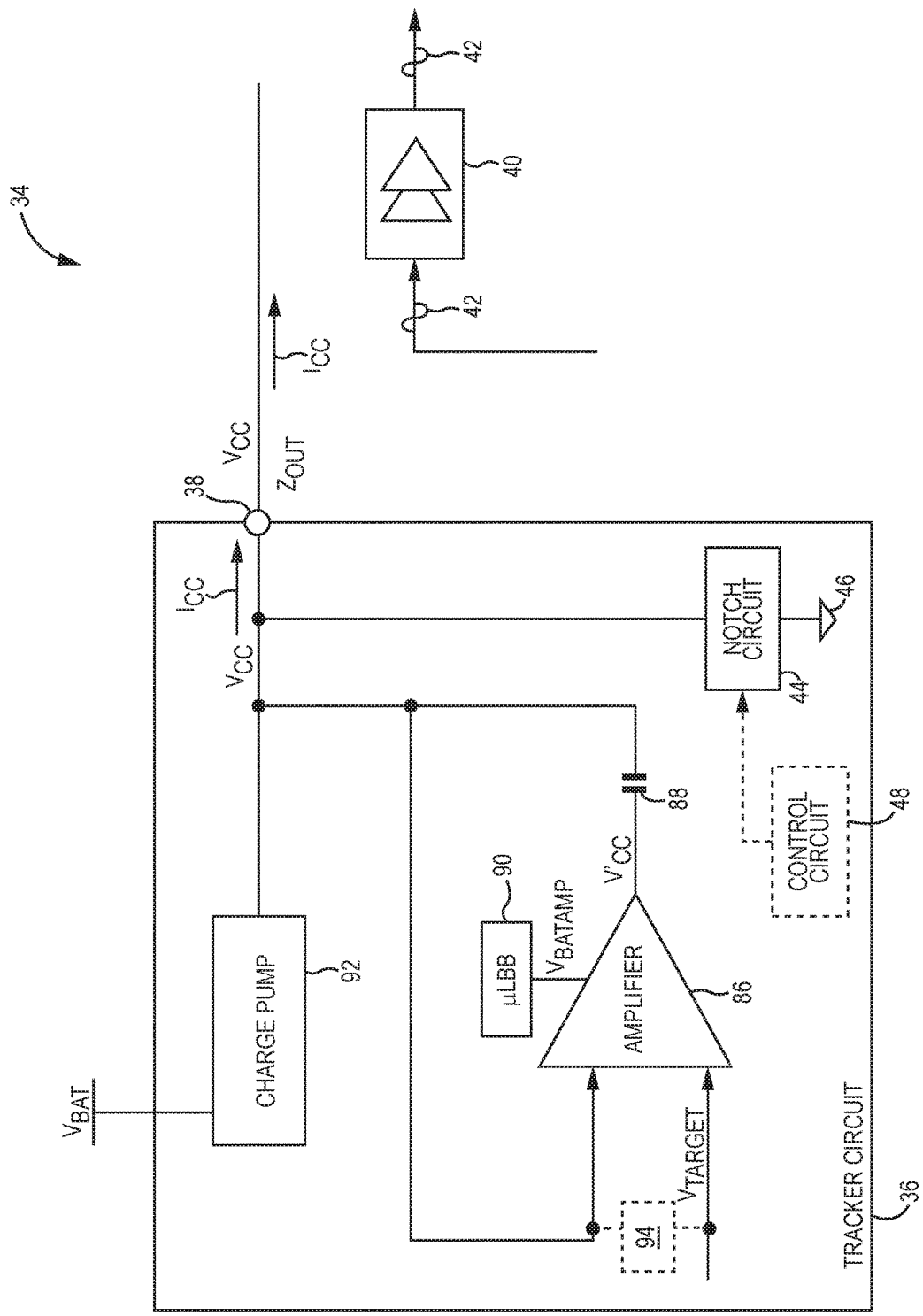
FIG. 2 is a schematic diagram of an exemplary wide modulation bandwidth RF circuit configured to filter a modulated voltage to help reduce distortions in the RF offset spectrums of FIG. 1D.

In this regard, FIG. 2 is a schematic diagram of an exemplary wide modulation bandwidth RF circuit 34 configured to filter a modulated voltage $V_{CC}$ to help reduce distortions in the RF offset spectrum 30 of FIG. 1D. The wide modulation bandwidth RF circuit 34 includes a tracker circuit 36 configured to generate the modulated voltage $V_{CC}$, which can be an ET modulated voltage, at a tracker output 38. The wide modulation bandwidth RF circuit 34 includes an amplifier circuit 40 configured to amplify an RF signal 42 based on the modulated voltage $V_{CC}$ for transmission in a TDD RF spectrum, such as the TDD RF spectrum 28 of FIG. 1D. In a non-limiting example, the tracker circuit 36 can support a wide modulation bandwidth of up to 160 MHz. Accordingly, the amplifier circuit 40 is able to amplify the RF signal 42 modulated with more than 400 resource blocks (RBs).

To help reduce the distortions in the RF offset spectrum 30, the wide modulation bandwidth RF circuit 34 includes a notch circuit 44 coupled between the tracker output 38 and a ground 46. As discussed in detail below, the notch circuit 44 can be configured to operate at a notch frequency located inside the RF offset spectrum 30 and with a notch bandwidth overlapping with at least a portion of the RF offset spectrum 30. In a non-limiting example, the notch circuit 44 can function as a bandpass or a bandstop filter to filter the modulated voltage $V_{CC}$ in the RF offset spectrum 30. As a result, it may be possible to reduce the distortions caused by the modulated voltage degradation in the RF offset spectrum 30, thus helping to improve linearity and efficiency of the amplifier circuit 40.

The notch circuit 44 may be controlled by a control circuit 48, which can be a microprocessor, a microcontroller, or a field-programmable gate array (FPGA), for example. The control circuit 48 can configure the notch circuit 44 to operate at the notch frequency and the notch bandwidth to filter the modulated voltage $V_{CC}$ in the RF offset spectrum 30. Like the tracker circuit 16 of FIG. 1A, the tracker circuit 36 can present the frequency-dependent output impedance $Z_{OUT}$ to the amplifier circuit 40. In this regard, the control circuit 48 configures the notch circuit 44 to reduce the frequency-dependent output impedance $Z_{OUT}$ to help suppress spectral regrowth in the RF offset spectrum 30.

As previously discussed in FIG. 1D, the RF offset spectrum 30 may include the lower offset spectrum 32L and the upper offset spectrum 32U. In this regard, in case the lower offset spectrum 32L and the upper offset spectrum 32U correspond to different bandwidths, the control circuit 48 may configure the notch circuit 44 to operate at the notch frequency between the lower offset spectrum 32L and the upper offset spectrum 32U. In case the lower offset spectrum 32L and the upper offset spectrum 32U correspond to equal bandwidths, the control circuit 48 may configure the notch circuit 44 to operate at the notch frequency in a middle of the RF offset spectrum 30. In either case, the control circuit 48 can further configure the notch circuit 44 to operate at the notch bandwidth overlapping with at least a portion of the lower offset spectrum 32L and at least a portion of the upper offset spectrum 32U.

In a non-limiting example, the notch circuit 44 can be a resistor-inductor-capacitor (RLC) circuit configured according to embodiments discussed next with reference to FIGS. 3A and 3B. Common elements between FIGS. 2, 3A, and 3B are shown therein with common element numbers and will not be re-described herein.

Figure 3A:
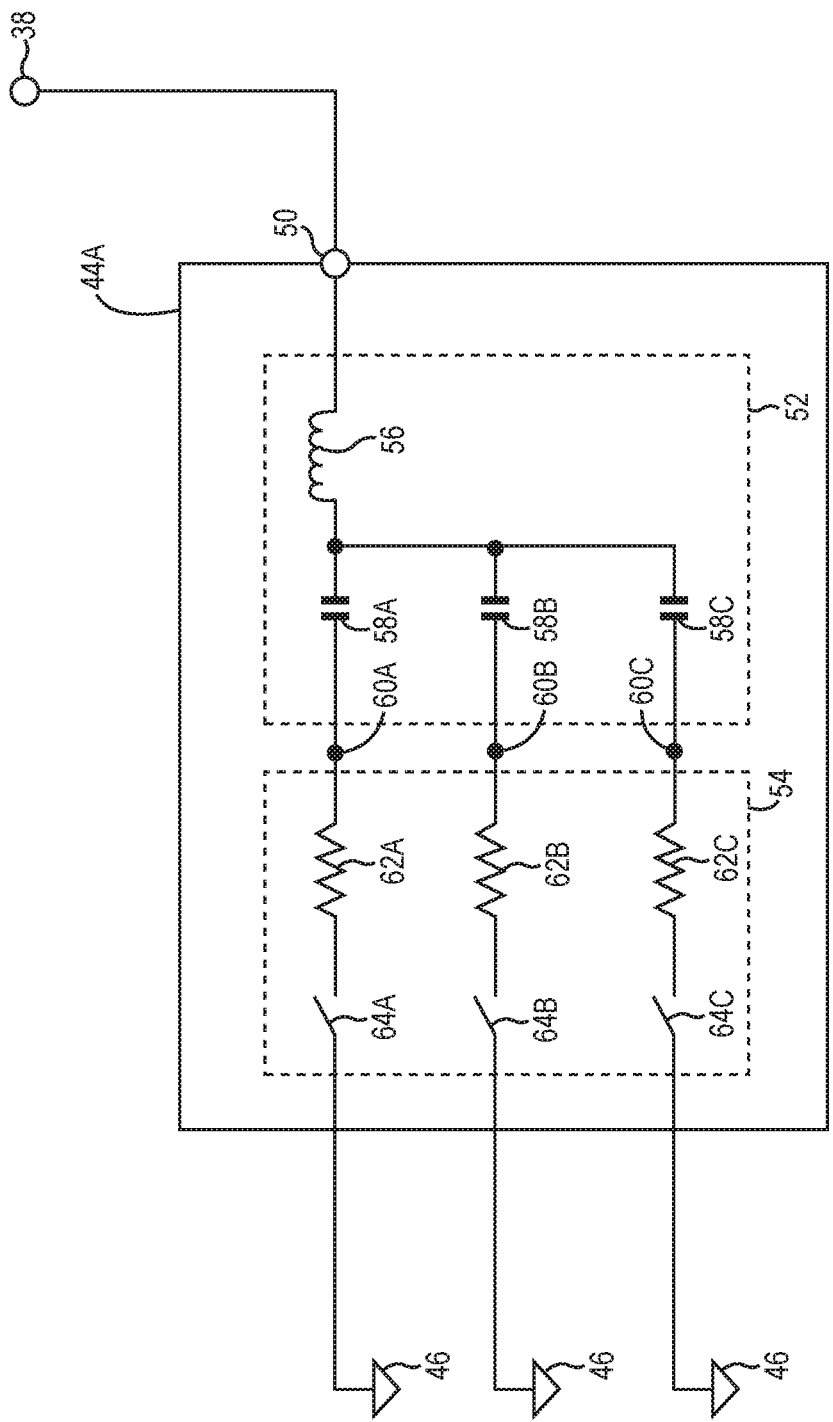
FIG. 3A is a schematic diagram of an exemplary notch circuit configured according to one embodiment of the present disclosure.
Figure 3B:
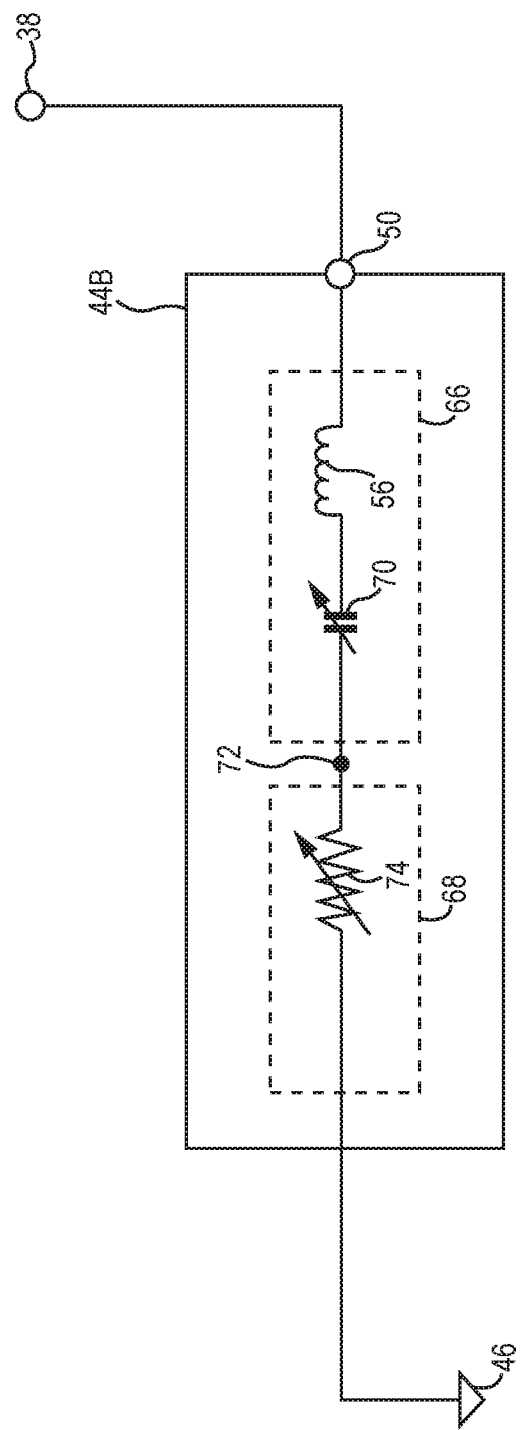
FIG. 3B is a schematic diagram of an exemplary notch circuit configured according to another embodiment of the present disclosure.

FIG. 3A is a schematic diagram of an exemplary notch circuit 44A, which can be provided as the notch circuit 44 in the wide modulation bandwidth RF circuit 34 of FIG. 2, configured according to one embodiment of the present disclosure. The notch circuit 44A includes a notch output 50 that is coupled to the tracker output 38. The notch circuit 44A includes first circuitry 52 and second circuitry 54. The first circuitry 52 is coupled to the notch output 50. The second circuitry 54 is coupled between the first circuitry 52 and the ground 46. In a non-limiting example, the second circuitry 54 can be integrated with the tracker circuit 36, while the first circuitry 52 is provided outside the tracker circuit 36 (e.g., on a printed circuit board).

The first circuitry 52 may be implemented as inductor-capacitor (LC) circuitry, which can be configured by the control circuit 48 to determine the notch frequency. In this regard, the first circuitry 52 can be configured to include an inductor 56 and at least three capacitors 58A, 58B, 58C. The capacitors 58A, 58B, 58C are coupled in parallel between the inductor 56 and at least three coupling points 60A, 60B, 60C, respectively.

The second circuitry 54 may be implemented as resistor circuitry, which can be configured by the control circuit 48 to set a quality point (Q-point) of the notch circuit 44 for determining the notch bandwidth. In this regard, the second circuitry 54 can be configured to include at least three resistors 62A, 62B, 62C and at least three switches 64A, 64B, 64C. The resistors 62A, 62B, and 62C are coupled in parallel between the coupling points 60A, 60B, 60C and the switches 64A, 64B, 64C, respectively. The switches 64A, 64B, 64C are configured to couple the resistors 62A, 62B, 62C, respectively, to the ground 46.

The control circuit 48 can selectively control (close) one or more of the switches 64A, 64B, 64C to set different notch frequencies and different notch bandwidths for the notch circuit 44A. For example, the control circuit 48 may close the switch 64A, while keeping the switches 64B, 64C open, to set the notch bandwidth based on the resistor 62A and to set the notch frequency based on the capacitor 58A and the inductor 56. The control circuit 48 may close the switches 64A, 64B while keeping the switch 64C open. Accordingly, the notch bandwidth will be set based on the resistors 62A, 62B and the notch frequency will be set based on the capacitors 58A, 58B and the inductor 56. In this regard, by selectively closing and opening the switches 64A, 64B, 64C, the notch circuit 44A can be configured to operate at eight (8) different notch frequencies and 8 different notch bandwidths.

The number of switches, resistors, and capacitors employed in the notch circuit 44A can be determined based on intended resolution with respect to the notch frequency and the notch bandwidth. For example, the notch circuit 44A can be configured to include four (4) switches, 4 resistors, and 4 capacitors to support sixteen (16) different notch frequencies and 16 different notch bandwidths. In this regard, the notch circuit discussed with reference to FIG. 3A is merely one of many possible configurations and should by no means be considered as being limiting.

FIG. 3B is a schematic diagram of an exemplary notch circuit 44B, which can be provided as the notch circuit 44 in the wide modulation bandwidth RF circuit 34 of FIG. 2, configured according to another embodiment of the present disclosure. The notch circuit 44B includes first circuitry 66 and second circuitry 68. The first circuitry 66, which can be an LC circuit, includes an adjustable capacitor 70 and the inductor 56. The adjustable capacitor 70 and the inductor 56 are coupled in series between a coupling point 72 and the notch output 50. The second circuitry 68 includes an adjustable resistor 74 provided between the coupling point 72 and the ground 46. Accordingly, the control circuit 48 can control the adjustable resistor 74 to set different Q-points for determining different notch bandwidths. The control circuit 48 can control the adjustable capacitor 70 to set different notch frequencies for the notch circuit 44B.

Figure 4:
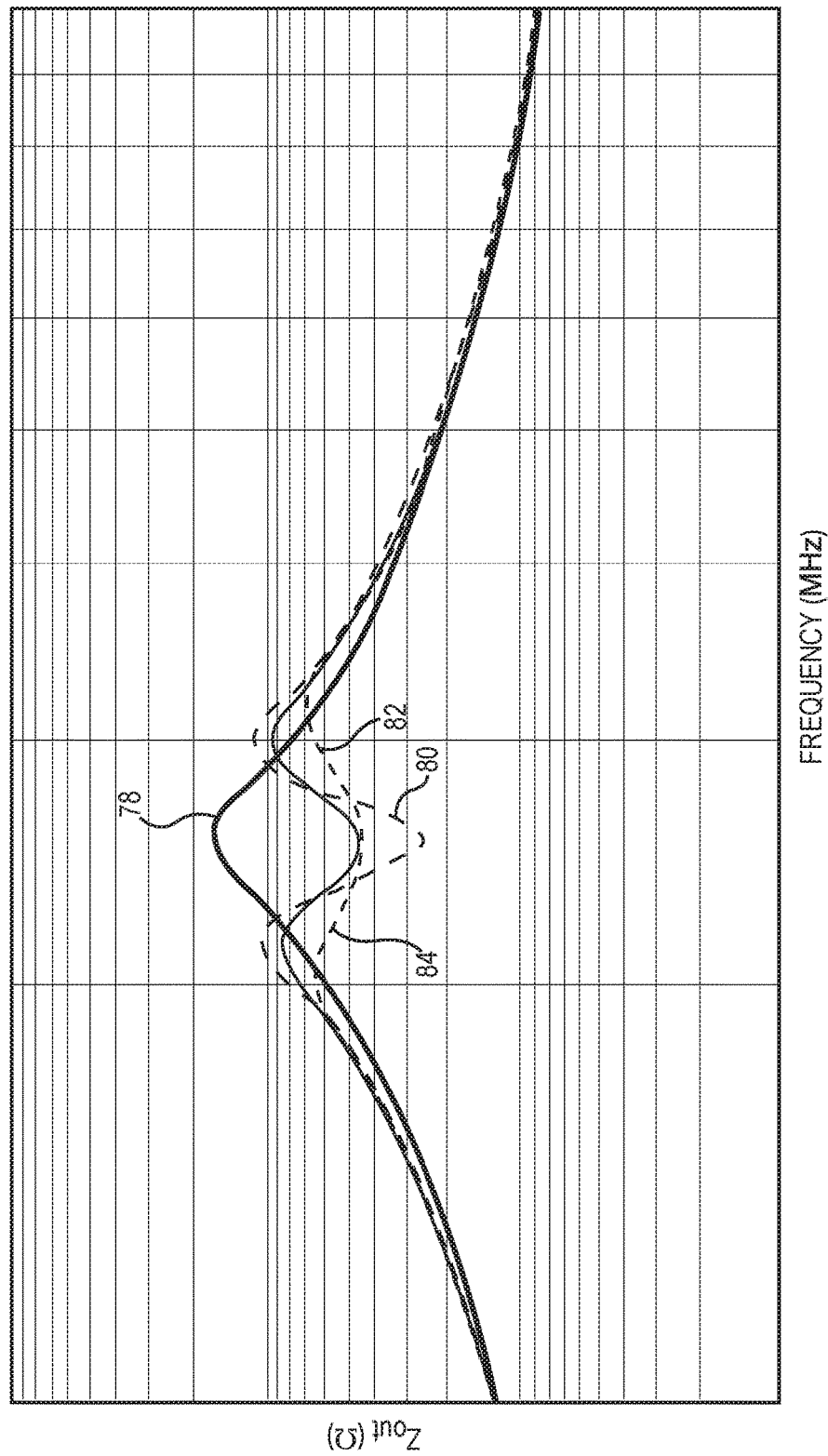
FIG. 4 is a graphic diagram providing an exemplary illustration of frequency-dependent output impedance before and after employing a notch circuit in the wide modulation bandwidth RF circuit of FIG. 2.

Simulation results show that, by employing the notch circuit 44 in the wide modulation bandwidth RF circuit 34, it is possible to reduce the frequency-dependent output impedance $Z_{OUT}$ of the tracker circuit 36 and thus reduce the distortions in the RF offset spectrum 30. In this regard, FIG. 4 is a graphic diagram 76 providing an exemplary illustration of the frequency-dependent output impedance $Z_{OUT}$ before and after employing the notch circuit 44 in the wide modulation bandwidth RF circuit 34 of FIG. 2.

The graphic diagram 76 includes a pre-notching curve 78 illustrating a frequency response of the frequency-dependent output impedance $Z_{OUT}$ without employing the notch circuit 44 in the wide modulation bandwidth RF circuit 34. The graphic diagram 76 includes a first post-notching curve 80, a second post-notching curve 82, and a third post-notching curve 84 illustrating respective frequency responses of the frequency-dependent output impedance $Z_{OUT}$ after employing the notch circuit 44 in the wide modulation bandwidth RF circuit 34.

The first post-notching curve 80 represents the frequency response of the frequency-dependent output impedance $Z_{OUT}$ when the notch circuit 44 is configured with 20 nH inductance, 20 pF capacitance, and 3Ω resistance. The second post-notching curve 82 represents the frequency response of the frequency-dependent output impedance $Z_{OUT}$ when the notch circuit 44 is configured with 20 nH inductance, 20 pF capacitance, and 6Ω resistance.

The third post-notching curve 84 represents the frequency response of the frequency-dependent output impedance $Z_{OUT}$ when the notch circuit 44 is configured with 10 nH inductance, 40 pF capacitance, and 6Ω resistance. As such, the combination of 10 nH inductance and 40 pF capacitance causes the notch circuit 44 to operate at the notch frequency of approximately 252 MHz. Simulation results show that the notch circuit 44 can reduce spectrum distortion by approximately 10 dB.

With reference back to FIG. 2, the tracker circuit 36 includes an amplifier 86 coupled to the tracker output 38 via an offset capacitor 88. The amplifier 86 is configured to generate an output voltage V'$_{CC}$ based on a supply voltage V$_{BATAMP}$. The offset capacitor 88 is configured to raise the output voltage V'$_{CC}$ to the modulated voltage V$_{CC}$. The amplifier 86 can be configured to receive a target voltage V$_{TARGET}$ having a time-variant target voltage envelope and generate an ET modulated output voltage V'$_{CC}$ corresponding to a time-variant voltage envelope tracking the time-variant target voltage envelope. Accordingly, the offset capacitor 88 raises the ET modulated output voltage V'$_{CC}$ to generate the ET modulated voltage V$_{CC}$.

The tracker circuit 36 includes a micro inductor-based buck-boost (μLBB) circuit 90 configured to provide the supply voltage V$_{BATAMP}$ to the amplifier 86. In a non-limiting example, the supply voltage V$_{BATAMP}$ can be a constant voltage. The tracker circuit 36 also includes a charge pump 92 configured to generate a current I$_{CC}$ at the tracker output 38 based on a battery voltage V$_{BAT}$. The current I$_{CC}$ can be a direct current, an alternating current, or a combination of both. The current I$_{CC}$ and the modulated voltage V$_{CC}$ cause the amplifier circuit 40 to amplify the RF signal 42 to a desired power level.

Notably, the notch circuit 44 may introduce a delay in a respective frequency response in the TDD RF spectrum 28 of FIG. 1D. Accordingly, the tracker circuit 36 can include a frequency equalizer 94 to compensate the delay introduced by the notch circuit 44. The frequency equalizer 94 may be either a digital frequency equalizer or an analog frequency equalizer.

The wide modulation bandwidth RF circuit 34 may be adapted to support a second amplifier circuit configured amplify a second RF signal for transmission in a frequency division duplex (FDD) RF transmit spectrum. In this regard, FIG. 5 is a schematic diagram of an exemplary wide modulation bandwidth RF circuit 34A configured to support TDD and FDD transmissions according to one embodiment of the present disclosure. Common elements between FIGS. 2 and 5 are shown therein with common element numbers and will not be re-described herein.

The wide modulation bandwidth RF circuit 34A includes a second amplifier circuit 96 configured to amplify a second RF signal 98 based on the modulated voltage V$_{CC}$ for transmission in an FDD RF transmit spectrum. The wide modulation bandwidth RF circuit 34 includes a tracker circuit 36A. The tracker circuit 36A includes an RF trap 100 coupled between the tracker output 38 and the ground 46. The RF trap 100 is configured to filter the modulated voltage V$_{CC}$ in an FDD RF receive spectrum that does not overlap with the FDD RF transmit spectrum. For a more detailed description of the RF trap 100, please refer to U.S. Pat. No. 9,298,198 B2.

The tracker circuit 36A further includes a notch circuit 44A, which is functionally equivalent to the notch circuit 44 of FIG. 2. The notch circuit 44A and the RF trap 100 can be configured according to a number of configurations. In this regard, FIG. 6A is a schematic diagram of illustrating an exemplary configuration of the notch circuit 44A and the RF trap 100 of FIG. 5 according to one embodiment of the present disclosure. Common elements between FIGS. 5 and 6A are shown therein with common element numbers and will not be re-described herein.

In a non-limiting example, the RF trap 100 includes a second inductor 102 coupled between the tracker output 38 and a first coupling node 104. The RF trap 100 also includes at least one second capacitor 106 coupled between at least one second coupling node 108 and the first coupling node 104. The second coupling node 108 is coupled to the ground 46 via at least one switch 109. In this regard, the RF trap 100 represents an inductor-capacitor (LC) circuit, which differs from the notch circuit 44 of FIGS. 2, 3A, and 3B.

Continuing with the non-limiting example, the notch circuit 44A includes an adjustable capacitor 110 and an adjustable resistor 112 coupled in series between the notch output 50 and the ground 46. The notch output 50 is coupled to the second coupling node 108 of the RF trap 100. As a result, the notch circuit 44A can eliminate the inductor 56 in FIGS. 3A and 3B.

FIG. 6B is a schematic diagram illustrating an exemplary configuration of the notch circuit 44A and the RF trap 100 of FIG. 5 according to another embodiment of the present disclosure. Common elements between FIGS. 5, 6A, and 6B are shown therein with common element numbers and will not be re-described herein. As shown in FIG. 6B, the notch output 50 of the notch circuit 44A is coupled to the first coupling node 104.

Those skilled in the art will recognize improvements and modifications to the preferred embodiments of the present disclosure. All such improvements and modifications are considered within the scope of the concepts disclosed herein and the claims that follow.

What is claimed is:

1. A wide modulation bandwidth radio frequency (RF) circuit comprising:
   a tracker circuit comprising a tracker output and configured to generate a modulated voltage at the tracker output;
   an amplifier circuit coupled to the tracker output and configured to amplify an RF transmit signal based on the modulated voltage for transmission in a selected RF spectrum;
   a notch circuit coupled between the tracker output and a ground, the notch circuit configured to filter the modulated voltage in an RF offset spectrum adjacent to the selected RF spectrum; and
   a control circuit configured to:
      adjust a notch frequency of the notch circuit to cause the notch frequency to fall in the RF offset spectrum; and
      adjust a notch bandwidth of the notch circuit to cause the notch bandwidth to overlap with at least a portion of the RF offset spectrum.

2. The wide modulation bandwidth RF circuit of claim 1 wherein:
   the tracker circuit has a frequency-dependent output impedance; and
   the notch circuit is further configured to reduce the frequency-dependent output impedance in the RF offset spectrum.

3. The wide modulation bandwidth RF circuit of claim 1 wherein:
   the RF offset spectrum comprises a lower offset spectrum and an upper offset spectrum different from the lower offset spectrum; and
   the control circuit is further configured to:
      adjust the notch frequency of the notch circuit to cause the notch frequency to fall between the lower offset spectrum and the upper offset spectrum; and
      adjust the notch bandwidth of the notch circuit to cause the notch bandwidth to overlap with at least a portion of the lower offset spectrum and at least a portion of the upper offset spectrum.

4. The wide modulation bandwidth RF circuit of claim 1 wherein:
the RF offset spectrum comprises a lower offset spectrum and an upper offset spectrum that is identical to the lower offset spectrum; and
the control circuit is further configured to:
adjust the notch frequency of the notch circuit to cause the notch frequency to fall in a middle of the RF offset spectrum; and
adjust the notch bandwidth of the notch circuit to cause the notch bandwidth to overlap with at least a portion of the lower offset spectrum and at least a portion of the upper offset spectrum.

5. The wide modulation bandwidth RF circuit of claim 1 wherein:
the tracker circuit is further configured to generate an envelope tracking (ET) modulated voltage at the tracker output; and
the amplifier circuit is further configured to amplify the RF transmit signal based on the ET modulated voltage.

6. The wide modulation bandwidth RF circuit of claim 1 wherein the notch circuit comprises:
a notch output coupled to the tracker output;
first circuitry coupled to the notch output and configured to determine the notch frequency; and
second circuitry coupled between the first circuitry and the ground, the second circuitry configured to determine the notch bandwidth.

7. The wide modulation bandwidth RF circuit of claim 6 wherein the second circuitry is integrated with the tracker circuit.

8. The wide modulation bandwidth RF circuit of claim 6 wherein:
the first circuitry comprises:
an inductor coupled to the notch output; and
at least three capacitors coupled in parallel to the inductor; and
the second circuitry comprises:
at least three resistors coupled in parallel to the at least three capacitors, respectively; and
at least three switches coupled in parallel between the at least three resistors, respectively, and the ground.

9. The wide modulation bandwidth RF circuit of claim 8 wherein the control circuit is further configured to selectively control the at least three switches to configure the notch circuit to operate in at least eight notch frequencies and at least eight notch bandwidths.

10. The wide modulation bandwidth RF circuit of claim 6 wherein:
the first circuitry comprises an inductor coupled to the notch output and an adjustable capacitor coupled to the inductor; and
the second circuitry comprises an adjustable resistor coupled between the adjustable capacitor and the ground.

11. The wide modulation bandwidth RF circuit of claim 10 wherein the control circuit is further configured to:
control the adjustable capacitor to determine the notch frequency; and
control the adjustable resistor to determine the notch bandwidth.

12. The wide modulation bandwidth RF circuit of claim 6 further comprising:
a second amplifier circuit configured to amplify a second RF signal based on the modulated voltage for transmission in a frequency division duplex (FDD) RF transmit spectrum; and
an RF trap coupled between the tracker output and the ground, the RF trap configured to filter the modulated voltage in an FDD RF receive spectrum non-overlapping with the FDD RF transmit spectrum.

13. The wide modulation bandwidth RF circuit of claim 12 wherein the RF trap comprises:
a second inductor coupled between the tracker output and a first coupling node; and
at least one second capacitor coupled between at least one second coupling node and the first coupling node.

14. The wide modulation bandwidth RF circuit of claim 13 wherein:
the first circuitry comprises an adjustable capacitor coupled to the notch output; and
the second circuitry comprises an adjustable resistor coupled between the adjustable capacitor and the ground.

15. The wide modulation bandwidth RF circuit of claim 14 wherein the notch output of the notch circuit is coupled to the at least one second coupling node.

16. The wide modulation bandwidth RF circuit of claim 14 wherein the notch output of the notch circuit is coupled to the first coupling node.

17. The wide modulation bandwidth RF circuit of claim 1 wherein the tracker circuit comprises:
an amplifier coupled to the tracker output and configured to generate the modulated voltage at the tracker output based on a supply voltage; and
a charge pump coupled to the tracker output and configured to generate a current at the tracker output.

18. The wide modulation bandwidth RF circuit of claim 17 wherein the tracker circuit further comprises a micro inductor-based buck-boost circuit configured to provide the supply voltage to the amplifier.

19. The wide modulation bandwidth RF circuit of claim 17 wherein the tracker circuit further comprises an offset capacitor configured to couple the amplifier to the tracker output.

20. The wide modulation bandwidth RF circuit of claim 17 wherein the amplifier circuit is coupled to a frequency equalizer configured to compensate for a delay caused by the notch circuit.

21. The wide modulation bandwidth RF circuit of claim 1 wherein the selected RF spectrum corresponds to a time division duplex (TDD) RF spectrum.

* * * * *